United States Patent
Cheng et al.

(10) Patent No.: US 6,870,494 B1
(45) Date of Patent: Mar. 22, 2005

(54) SYSTEM OF MULTI-CHANNEL SHARED RESISTOR-STRING DIGITAL-TO-ANALOG CONVERTERS AND METHOD OF THE SAME

(75) Inventors: Eric Cheng, Taipei (TW); Wen-Lung Shieh, Taipei (TW); Chih-Hung Tseng, Taipei (TW); Hipolk Lu, Taipei (TW)

(73) Assignee: C-Media Electronics Inc., Taipei (TW)

( * ) Notice: Subject to any disclaimer, the term of this patent is extended or adjusted under 35 U.S.C. 154(b) by 0 days.

(21) Appl. No.: 10/676,950

(22) Filed: Oct. 1, 2003

(51) Int. Cl.⁷ .................................................. H03M 1/66
(52) U.S. Cl. ........................ 341/144; 341/143; 341/145
(58) Field of Search ............................... 341/144, 143, 341/118, 120, 145, 149, 159; 31/154, 150

(56) References Cited

U.S. PATENT DOCUMENTS

| | | | |
|---|---|---|---|
| 5,841,382 A | * 11/1998 | Walden et al. | 341/120 |
| 6,281,821 B1 | * 8/2001 | Rhode et al. | 341/144 |
| 6,433,719 B2 | * 8/2002 | Yoon | 341/144 |
| 6,583,662 B1 | * 6/2003 | Lim | 327/553 |

* cited by examiner

Primary Examiner—Michael Tokar
Assistant Examiner—John B Nguyen
(74) Attorney, Agent, or Firm—Perkins Coie LLP

(57) ABSTRACT

System of multi-channel shared resistor-string digital-to-analog converters comprises a time-sharing interpolator converting the multi-channel digital audio input at low sample rate to the multi-channel digital audio output at high sample rate, a time-sharing sigma-delta modulator modulating the multi-channel digital audio input with a long sample wordlength from the interpolator to be a multi-channel digital audio output with a shorter sample wordlength, multi-channel shared resistor-string digital-to-analog converters converting the multi-channel digital audio input to be a multi-channel staircase analog signal output, and one low-order RC filter for each channel further attenuating the out-of-band noise in the analog staircase analog output, especially the high-frequency residue images.

31 Claims, 3 Drawing Sheets

SYSTEM OF MULTI-CHANNEL SHARED RESISTOR-STRING DIGITAL-TO-ANALOG CONVERTERS AND METHOD OF THE SAME

TECHNICAL FIELD

The present invention relates to a multi-channel audio digital to analog converters, and specifically, to a system of high-resolution multi-channel shared resistor-string digital-to-analog converters and the method of the same.

BACKGROUND

In the field of digital-to-analog conversion technology for audio, the conversion rate is typically low, however, the accuracy requirement is getting more and more stringent. The audio application specifications demand multi-channel playback much more than before. Therefore, it is a task to achieve the purpose of accuracy and multi-channel output performance while maintain the product competitiveness (low cost).

The most important considerations under the accuracy specifications include the dynamic range (DR) and the signal to noise plus distortion ratio (SNDR). The dynamic range (DR) is defined as a measurement of the noise generated from the digital-to-analog converters, and the signal-to-noise-plus-distortion ratio (SNDR) is indicated as a measurement of converters linearity. There are several of digital-to-analog converters. According to the classification of conversion rate, there are two types of the devices, one is Nyquist-rate converters and another one is over-sampled converters.

In the Nyquist-rate converters, one of the straightforward implantation is so called resistor string voltage division DACs (digital-to-analog converters), another way is resistor string DACs. The primary drawback of the resistor string DACs is that the string resistor matching is limited by the VLSI technology. The resistance mismatch of the string resistor is caused by the process deviation and it will directly influence the voltage division accuracy of the resistor string. The incorrect voltage division will cause poor performance on the SNDR in the resistor string DACs. Therefore, the resistor string DACs is seldom employed in the conventional high resolution DAC.

However, resistor string DAC has some advantages. One of the advantages is that the device has the capability to provide high dynamic range (DR). The primary noise source of the resistor string DACs arises mainly from the resistor string thermal noise, switch and output buffer thermal noise and 1/f noise. Hence, its noise floor is extremely low and the characteristic of dynamic range (DR) is excellent. The further benefit for the resistor string DACs is that the device can be operated at high speeds, thereby achieving the facility of high sample rate conversion application.

The major over-sampled digital-to-analog converter is the Sigma-delta digital-to-analog converter, and the device shares a big marketing.

FIG. 1 shows a block diagram for typical single channel sigma-delta DAC (digital-to-analog converter) in accordance with the prior art. The binary digit of the input could be N bits (N may be 16, 18, 20, 24) Nyquist-rate PCM digital audio source. The sample rate $F_{N\_in}$ is interpolated by an interpolator 100 to increase the sampling rate to R times, namely, $RF_{N\_in}$. The N bits $RF_{N\_in}$ data is then reduced the wordlength to M-bit per sample by a sigma-delta modulator 110, M is smaller than N, the quantization noise generated during the procedure will be shifted to the high frequency outside the baseband via the loop.

The M-bits output of the sigma-delta modulator 110 is subsequently transformed to a staircase analog signal by M-bits digital-to-analog converters. Finally, the staircase analog signal is filtered out-of-band noise by a switched-capacitor low-pass filter 130 and a continuous-time low-pass filter 140, thereby reconstructing the analog audio signal. However, 1-bit sigma-delta digital-to-analog converters prone to instability and high clock rate issue that cause application limitation on the DAC applications that require high resolution and high bandwidth.

Further, substantial out-of-band quantization noise is generated during the sigma-delta modulator stage such that the digital-to-analog converters output need high-order low-pass filters to filter out such noise to sufficient low to avoid slewing phenomenon generated by the audio amplifier, thereby inducing the inter-modulation and harmonic distortion. As known, those will influence the output quality, seriously. Multi-bit sigma-delta digital-to-analog converters (including MASH DACS) can resolve aforementioned instability, high clock rate issue and reduce the stage required on the low-pass post-filter.

In general, the bit number of the multi-bit sigma-delta DAC is less than 5 bits (including 5 bits) after the modulation by a sigma-delta modulation, and therefore, the SCF stage for extremely high level out-of-band quantization noise power can not be omitted. The low-noise SCF design becomes the key for overall performance of sigma-delta DACS.

Moreover, in multi-channel applications, the SCF of traditional sigma-delta DAC is unlikely to be used mutually, so that how to reduce the cost to increase competitiveness is an issue.

In view of above description, the present invention provides a system and output method of novel multi-channel audio DACs.

SUMMARY

The present invention provides a system of multi-channel shared resistor-string digital-to-analog converters, comprising: an interpolator for converting a multi-channel digital audio input at a sample rate into a multi-channel digital audio output with R multiples of the input sample rate; a modulator for modulating the multi-channel digital audio output to be a multi-channel digital audio output with a shorter sample wordlength and high-pass quantization noise; a multi-channel shared resistor-string digital-to-analog converters for converting the multi-channel digital audio output to a multi-channel analog audio output; and a plurality of filters for attenuating the residue images of out-of-band noise in the multi-channel analog audio to complete the multi-channel analog audio reconstruction output.

Wherein the interpolator is a time-sharing interpolator, the modulator is a time-sharing sigma-delta modulator, the multi-channel analog audio output is a multi-channel analog staircase waveform outputs, and the plurality of filters are plurality of first order RC filters. The multi-channel shared resistor-string digital-to-analog converters comprises: a shared resistor string for providing voltage levels of each channel demand; a plurality of decoders for receiving a M bits modulated digital input signal and then outputting $2^M$ digital signal; a plurality of switches connected to the shared resistor string and the plurality of decoders; and a plurality of buffers for outputting the selected voltage levels; wherein each of the plurality of switches corresponds to one the voltage level of the shared resistor string, and of one the $2^M$ digital signal turning on one of the corresponding switch, then outputting the signal.

The system of multi-channel shared resistor-string digital-to-analog converters, comprising: a time-sharing interpolator for converting a multi-channel digital audio input at a sample rate into a multi-channel digital audio output with R multiples of the input sample rate; a time-sharing sigma-delta modulator for modulating the multi-channel digital audio output to be a multi-channel digital audio output with a shorter sample wordlength and high-pass quantization noise; a multi-channel shared resistor-string digital-to-analog converters for converting the multi-channel digital audio output to a multi-channel analog audio output; and a plurality of first order low-pass filters for attenuating the residue images of out-of-band noise in the multi-channel analog audio to complete the multi-channel analog audio reconstruction output.

Wherein the multi-channel analog audio output is a multi-channel analog staircase waveform outputs. The multi-channel shared resistor-string digital-to-analog converters comprises: a shared resistor string for providing voltage levels of each channel demand; a plurality of decoders for receiving a M bits modulated digital input signal and then outputting $2^M$ digital signal; a plurality of switches connected to the shared resistor string and the plurality of decoders; and a plurality of buffers for outputting the selected voltage levels; wherein each of the plurality of switches corresponds to one of the voltage level of the shared resistor string, and one of the $2^M$ digital signal turning on one the corresponding switch, then outputting the signal.

The present invention discloses an output method of multi-channel shared resistor-string digital-to-analog converters, comprising:

converting a multi-channel digital audio input at a sample rate into a multi-channel digital audio output with R multiples of the input sample rate by an interpolator;

modulating the multi-channel digital audio output to be a multi-channel digital audio output with a shorter sample wordlength and high-pass quantization noise;

transforming the multi-channel digital audio output to a multi-channel analog audio output by using a multi-channel shared resistor-string digital-to-analog converters to; and attenuating the residue images of out-of-band noise in the multi-channel analog audio to complete the multi-channel analog audio reconstruction output. Wherein the multi-channel shared resistor-string digital-to-analog converters comprises: a shared resistor string for providing voltage levels of each channel demand; a plurality of decoders for receiving a M bits modulated digital input signal and then outputting $2^M$ digital signal; a plurality of switches connected to the shared resistor string and the plurality of decoders; and a plurality of buffers for outputting the selected voltage levels; wherein each of the plurality of switches corresponds to one the voltage level of the shared resistor string, and one of the $2^M$ digital signal turning on one of the corresponding switch, then outputting the signal.

An output method of multi-channel shared resistor-string digital-to-analog converters, comprising:

using an interpolator to convert a multi-channel digital audio input at some sample rate into a multi-channel digital audio output with R multiples of the input sample rate;

using a multi-channel shared resistor-string digital-to-analog converters to convert the multi-channel digital audio output to a multi-channel analog audio output; and using a plurality of low-order low-pass filters to attenuate the residue images of out-of-band noise in the multi-channel analog audio to complete the multi-channel analog audio reconstruction output.

Wherein the interpolator is a time-sharing interpolator, the multi-channel analog audio output is a multi-channel analog staircase waveform outputs, and the plurality of low-order low-pass filters are plurality of first order RC filters. Wherein the multi-channel shared resistor-string digital-to-analog converters comprises: a shared resistor string for providing voltage levels of each channel demand; a plurality of decoders for receiving a M bits modulated digital input signal and then outputting $2^M$ digital signal; a plurality of switches connected to the shared resistor string and the plurality of decoders; and a plurality of buffers for outputting the selected voltage levels; wherein each of the plurality of switches corresponds to one the voltage level of the shared resistor string, and one of the $2^M$ digital signal turning on one of the corresponding switch and outputting the signal.

The present invention also provides an output method of multi-channel shared resistor-string digital-to-analog converters, comprising:

using a multi-channel shared resistor-string digital-to-analog converters to convert the multi-channel digital audio input to a multi-channel analog audio output; and using a plurality of high-order low-pass filters to attenuate the residue images of out-of-band noise in the multi-channel analog audio to complete the multi-channel analog audio reconstruction output.

Wherein the interpolator is a time-sharing interpolator, the multi-channel analog audio signal output is a multi-channel analog staircase waveform outputs, and the plurality of high-order low-pass filters are plurality of high-order RC filters. The multi-channel shared resistor-string digital-to-analog converters comprises: a shared resistor string for providing voltage levels of each channel demand; a plurality of decoders for receiving a M bits modulated digital input signal and then outputting $2^M$ digital signal; a plurality of switches connected to the shared resistor string and the plurality of decoders; and a plurality of buffers for outputting the selected voltage levels; wherein each of the plurality of switches corresponds to one the voltage level of the shared resistor string, and one of the $2^M$ digital signal turning on one of the corresponding switch, then outputting the signal.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
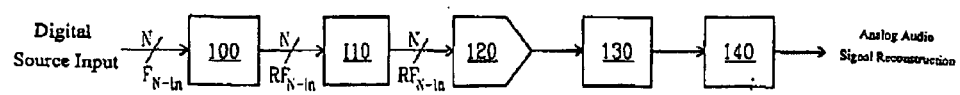
FIG. 1 is a system diagram of typical single channel sigma-delta digital-to-analog converters in accordance with the prior art.
Figure 2:
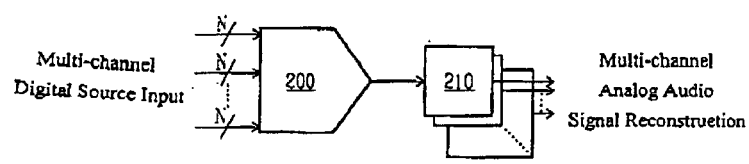
FIG. 2 is a system diagram of multi-channel shared resistor-string digital-to-analog converters in accordance with the present invention.

FIG. 2 is a system diagram of multi-channel shared resistor-string DACs (digital-to-analog converters) in accordance with the present invention. Turning to FIG. 2, a multi-channel shared resistor-string digital-to-analog converters 200 are used for converting the multi-channel digital audio output to a multi-channel analog audio output. In practical applications, the shared resistor string may use multiple resistor strings to reduce the resistor number. For example, 16 bits shared resistor string DACs, the shared resistor string can separate two resistor strings including 256 number resistors, and therefore the total number resistors are 512. In the present invention, the shared resistor string needs only single resistor string, therefore it can reduce substantially area of the multi-channel resistor-string.

Moreover, pluralities of high-order low-pass filters 210 are used to attenuate the residue images of out-of-band noise in the multi-channel analog audio output in order to complete the multi-channel analog audio output reconstruction. The high-order low-pass filter 210 includes a high-order RC filter 210.

Figure 3:
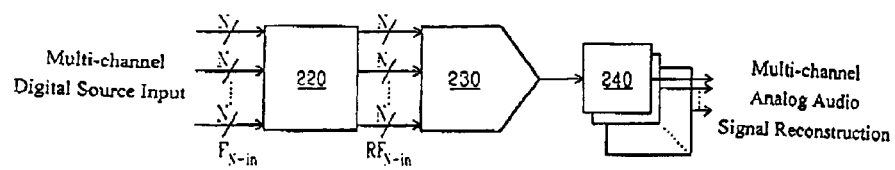
FIG. 3 is a system diagram of multi-channel shared resistor-string digital-to-analog converters in accordance with the present invention.

FIG. 3 is another preferred system diagram of multi-channel shared resistor-string digital-to-analog converters in accordance with the present invention. The time-sharing interpolator 220 is used to interpolate a multi-channel digital audio input. The sample wordlength of the multi-channel digital audio input may be 16, 18, 20, 22, 24 or required bit number of other high-resolution audio standard. The sample ratio $F_{N\_in}$ of the multi-channel digital audio input is converted into a multi-channel digital audio output at R times of the input sample rate ($RF_{N\_in}$), which is interpolated by the time-sharing interpolator 220. The output sample wordlength remains slightly longer than or equal to the input sample wordlength. It can decrease the level of the matching requirements for the multi-channel shared resistor-string DACs by the usage of the oversampling.

The multi-channel shared resistor-string DACs 230 are utilized to convert the multi-channel digital audio output to a multi-channel analog staircase waveform outputs. In practical applications, the shared resistor-string may include the multiple resistor strings to reduce the resistor number. Take the 16-bits shared resistor-string digital-to-analog converters as an example, the shared resistor-string can separate into two resistor-string including 256 resistors, and therefore the total number of the resistors is 512. In the present invention, the required shared resistor-string of the multi-channel resistor-string DACs is only single one resistor-string. Therefore, the present invention may reduce substantially area of the multi-channel resistor-string.

Furthermore, pluralities of low-order low-pass filters 240 are used to attenuate the residue images of out-of-band noise in the multi-channel analog audio input, thereby reconstructing the multi-channel analog audio reconstruction output. The low-order low-pass filter 240 includes a low-order RC filter 240.

Figure 4:
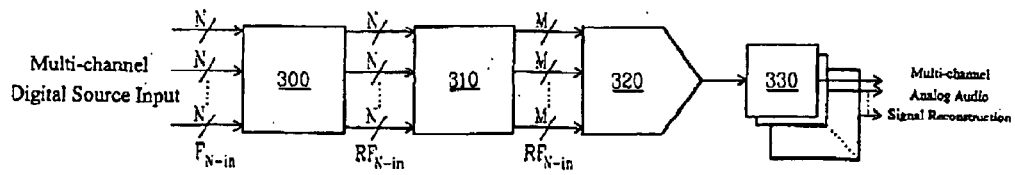
FIG. 4 is a system diagram of multi-channel shared resistor-string digital-to-analog converters in accordance with the present invention.

FIG. 4 is yet another system diagram of multi-channel shared resistor-string digital-to-analog converters in accordance with the present invention. The time-sharing interpolator 300 is used to interpolate a multi-channel digital audio input. The sample wordlength of the multi-channel digital audio input may be 16, 18, 20, 22, 24 or required bit number of other high-resolution audio standard. The sample ratio $F_{N\_in}$ of the multi-channel digital audio input is converted into R times of the initial input sample rate $RF_{N\_in}$ by the time-sharing interpolator 300. The output sample wordlength will remains slightly longer than or equal to the input sample wordlength. As mentioned, the matching requirements will be reduced.

The time-sharing sigma-delta modulator 310 is used to modulate the multi-channel digital audio input that is interpolated by time-sharing interpolator 300 to a multi-channel digital audio output having shorter sample wordlength and high-pass quantization noise. The time-sharing sigma-delta modulator 310 re-quantize the N bits sample rate $RF_{N\_in}$ multi-channel digital audio input to a M bits sample rate $RF_{N\_in}$ multi-channel digital audio output from the time-sharing interpolator 300, wherein M is smaller than N. The quantization noise created in the re-quantization process may be modulated to high frequency via a loop for maintaining the low noise and low harmonic distortion on baseband.

In general, the output bit number of sigma-delta modulator is less than 5 bits (including 5 bits), and the bit number of the sigma-delta modulator 310 output may reach 10~14 bits. It assumes that the number of the output bit for the sigma-delta modulator 310 is 12 bits and the noise transfer function of the sigma-delta modulator 310 is $(1-z^{-1})^2$, and therefore the out-of-band quantization noise power created by the sigma-delta modulator 310 is smaller than −71 dB (−6.02*12−1.76+3 dB) relative to the full-scale sinusoidal input power. The out-of-band quantization noise power created by conventional sigma-delta DACs modulator, for example sigma-delta modulator stage output 5 bits, is approximately −28 dB (−6.02*5−1.76+3 dB).

Figure 5:
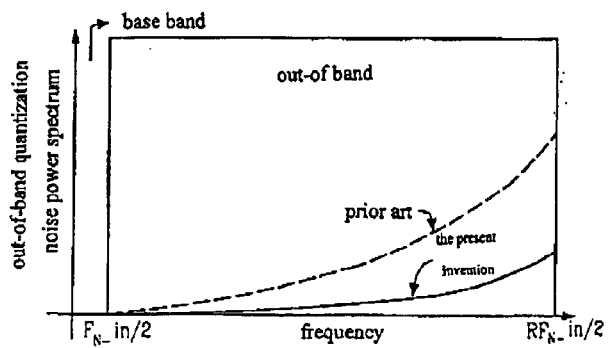
FIG. 5 is a comparison diagram of out-of-band quantization noise power between sigma-delta modulator of conventional sigma-delta digital-to-analog converters and sigma-delta modulator of the present invention.

FIG. 5 is a comparison diagram of out-of-band quantization noise power between sigma-delta modulator of conventional sigma-delta DACs and the present invention. The area covered from the solid line to the horizontal axis indicates the out-of-band quantization noise power created by the sigma-delta modulator 310 according to the present invention. Similarly, the region from the dot line to the horizontal axis represents the out-of-band quantization noise power generated by the output of the conventional sigma-delta DACs. Although the sigma-delta modulation 310 is incorporated into the present invention as the intermediate stage to lower the sample wordlength, however, the output still maintains 10–14 bits. Hence, the out-of-band quantization noise keeps in extremely low level to omit the SCF stage required by the conventional sigma-delta DACs. The sigma-delta modulation 310 may only reduce fewer bits such that it can lower the order and oversampling ratio of the sigma-delta modulation 310 and it may considerably provide the function of time-sharing.

The multi-channel shared resistor-string digital-to-analog converters 320 can convert the multi-channel digital audio input modulated by the sigma-delta modulation 310 to a multi-channel analog staircase outputs, as shown in FIG. 4. That is to say, the multi-channel digital audio input that is modulated by the sigma-delta modulation 310 is converted into a multi-channel analog staircase outputs by the multi-channel shared resistor-string digital-to-analog converters 320. The multi-channel shared resistor-string digital-to-analog converters 320 includes a shared resistor string, a plurality of decoders, a plurality of switches and a plurality of buffers.

Figure 6:
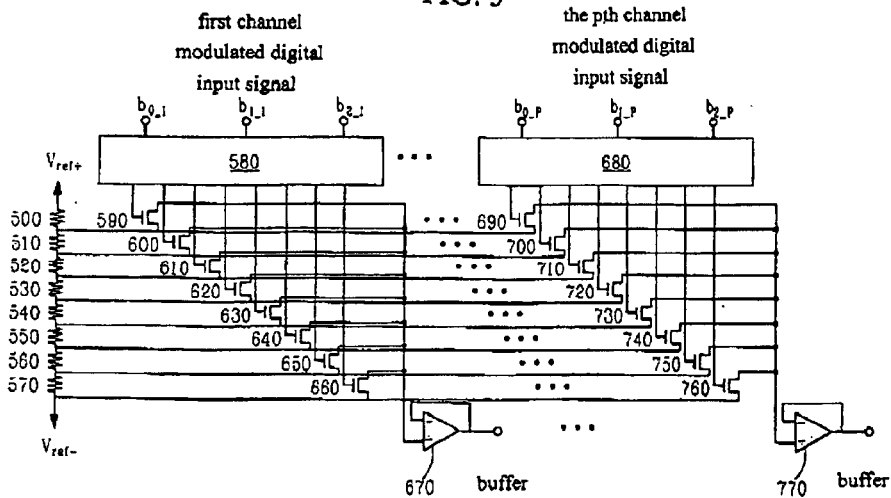
FIG. 6 is a scheme of multi-channel shared resistor-string digital-to-analog converters in accordance with the present invention.

In one embodiment, the output of the sigma-delta modulation 310 is 3 bits (in practice, the output is 10~14 bits), and the present invention introduces the p channels 3 bits shared resistor-string DACs as shown in FIG. 6. The resistors 500,510,520,530,540,550,560 and 570 may provide a series of voltage levels that can be shared in the p-channels shared resistor-string DACs. The decoder 580 of the first channel receives modulated 3 bits digital input signal, and then outputs 8 digital signals. One of the 8 digital signals is responsive to turn on the correspondent switch, such as switches 590,600,610,620,630,640,650 or 660. The digital signal that makes the switch to open will output an analog staircase waveform through a buffer 670 by a correspondent voltage level of the shared resistor string. The switch 590, 600,610,620,630,640,650 or 660 is, for example, a MOS or CMOS switch.

Moreover, the decoder 680 of the p channel receives modulated 3 bits digital input signal. Subsequently, it outputs 8 digital signals. One of the digital signals will also turn on the correspondent switch, such as switches 690,700,710, 720,730,740,750 or 760. As aforementioned, the digital signal outputs an analog staircase waveform through a buffer 770 via the shared resistor string. Similarly, the switch 690,700,710,720,730,740,750 or 760 is, for example, a MOS or CMOS switch.

In one current practical application, the shared resistor-string in FIG. 6 may use multiple resistor strings to reduce the number of the resistor. Take the 12-bits shared resistor-string DACs as an example, the shared resistor-string can be separated into two resistor-string including 64 resistors. The total number of the resistors is 128. In the present invention, the required shared resistor-string of the multi-channel resistor-string DACs is only single resistor-string. Apparently, it can reduce substantially the area of the multi-channel resistor-string. Furthermore, the poor linearity issue can be improved by enlarging the area of the shared resistor-string and employing the over-sampling techniques. The enlarged area of the shared resistor-string can improve the resistor string voltage division accuracy by reducing relative random geometry errors in process. Moreover, the usage of the over-sampling techniques distributes the power of harmonic distortion generated by the string resistor mismatches issue to the wider bandwidth, thereby improving the THD performance in the baseband.

Figure 7:
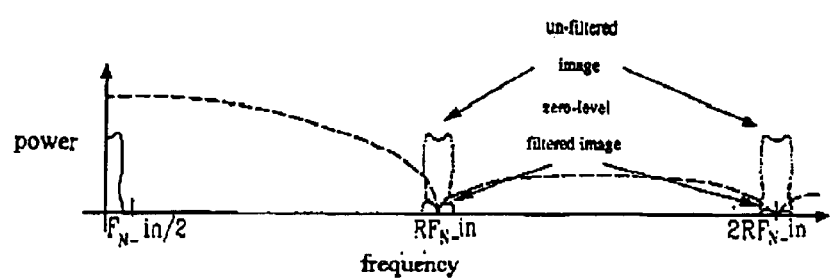
FIG. 7 is a scheme of the residue images of multi-channel analog staircase waveform outputs at integral multiple oversampling rate in accordance with the present invention.

The power of the out-of-band quantization noise is extremely low in the analog staircase waveform outputs by using the multi-channel shared resistor-string DACs 320 due to the sigma-delta modulation 310 maintains 10~14 bits outputs, so that the analog audio signal reconstruction needs to consider the images at the multiple sample frequency, only. The images will be filtered below to a certain level through a sample-and-hold function of the multi-channel shared resistor-string DACs 320, please refer to FIG. 7. Take 48 kHz digital audio as an example, assume that the baseband bandwidth is 0~20 kHz, the images minimum attenuation caused by the sample-and-hold function in different over-sampling ratio is shown in table one. From table. 1, the images minimum attenuation is 37.60 dB when the over-sampling ratio is 32.

TABLE 1

| Oversampling Ratio | 8 | 16 | 32 | 64 | 128 |
|---|---|---|---|---|---|
| Min. Attenuation (dB) | 25.24 | 31.47 | 37.60 | 43.67 | 49.72 |

Finally, the analog staircase outputs of each channel are processed by a low-order RC filters 330 to further attenuate the residue images, as shown in FIG. 4. The low-order RC filters 330, for example, are the first-order RC filters 330. It needs an extremely high over-sampling ratio to avoid back level entering slewing mode via the sample-and-hold function to filter out the images to a sufficient low level. Therefore, it needs to introduce the low-order low-pass filters for filtering out the residue images by the sample-and-hold function to a sufficient low level. The simple RC filter can be used under such condition of that the over-sampling ratio is high enough to separate the images far from base-band. In one embodiment, 32 over-sampling ratio is used by 48 kHz digital audio along with a first-order RC filter with −3 dB at 48 kHz. The images minimum attenuation is 67.70 dB. Apparently, it is capable to filter out the images by using the sample-and-hold function of the multi-channel shared resistor-string DACs 320.

The advantage of the present invention includes the following description:

1. One voltage division resistor-string are shared by the multi-channel resistor-string voltage division digital-to-analog converters, thereby reducing the area occupied by the conventional manner.

2. It can reduce the resistor-string number of the shared resistor-string DACs through Over-sampling ratio and sigma-delta modulation techniques. Further, it reduces the area of the resistor to reduce the complexities of the routing issue when sharing the resistor string in the field of high-resolution multi-channel applications.

3. By introducing the over-sampling ratio, the requirement for the resistor string matching can be reduced.

4. The required number of resistor string had slashed through the usage of the shared resistor-string and the sigma-delta modulation techniques, therefore, the insufficient resistor-string voltage division accuracy in process variations can be overcame by increasing the area of each resistor string.

5. The requirement of the switched-capacitor filters of typical sigma-delta DACs can be omitted due to the high-bit outputs of the sigma-delta modulation techniques.

6. The lower digital time-pulse frequency and the shared resistor-string can reduce the power dissipation consumed by the resistor-string.

7. The high frequency residue images can be filtered out by the usage of the low-order RC filters, for example the first-order lowpass RC filters.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

We claim:

1. A system of multi-channel shared resistor-string digital-to-analog converters (DACs) comprising:
   a multi-channel shared resistor-string digital-to-analog converters for converting multi-channel digital audio input to a multi-channel analog audio output; and
   a plurality of high-order low-pass filters for attenuating the residue images of out-of-band noise in said multi-channel analog audio output, thereby reconstructing said multi-channel analog audio output.

2. The system of claim 1, wherein said multi-channel analog audio signal output includes a multi-channel analog staircase waveform outputs, and said plurality of high-order low-pass filters includes plurality of high-order RC filters.

3. The system of claim 1, wherein said multi-channel shared resistor-string digital-to-analog converters comprises:
   a shared resistor string for providing voltage levels of each channel demand;
   a plurality of decoders for receiving a M bits modulated digital input signal and then outputting 2M digital signal;
   a plurality of switches connected to said shared resistor string and said plurality of decoders; and
   a plurality of buffers for outputting said selected voltage levels;
   wherein each of said plurality of switches corresponds to one voltage level of said shared resistor string, and only one of said 2M digital signal turning on one of said corresponding switch and outputting signal.

4. The system of claim 3, wherein said switch includes MOS or CMOS.

5. A system of multi-channel shared resistor-string digital-to-analog converters, comprising:
   an interpolator for converting a multi-channel digital audio input at a sample rate into a multi-channel digital audio output with R multiples of said input sample rate;
   a multi-channel shared resistor-string digital-to-analog converters for converting multi-channel digital audio input to a multi-channel analog audio output; and
   a plurality of high-order low-pass filters for attenuating the residue images of out-of-band noise in said multi-channel analog audio output, thereby reconstructing said multi-channel analog audio output.

6. The system of claim 5, wherein said interpolator is a time-sharing interpolator, and said multi-channel analog audio signal output is a multi-channel analog staircase waveform outputs, and said plurality of high-order low-pass filters are a plurality of first order RC filters.

7. The system of claim 5, wherein said multi-channel shared resistor-string digital-to-analog converters comprises:
   a shared resistor string for providing voltage levels of each channel demand;
   a plurality of decoders for receiving a M bits modulated digital input signal and then outputting 2M digital signal;
   a plurality of switches connected to said shared resistor string and said plurality of decoders; and
   a plurality of buffers for outputting said selected voltage levels;
   wherein each of said plurality of switches corresponds to one voltage level of said shared resistor string, and only one of said 2M digital signal turning on one of said corresponding switch and outputting signal.

8. The system of claim 7, wherein said switch is MOS or CMOS.

9. A system of multi-channel shared resistor-string digital-to-analog converters, comprising:
   a time-sharing interpolator for converting a multi-channel digital audio input at some sample rate into a multi-channel digital audio output with R multiples of said input sample rate;
   a multi-channel shared resistor-string digital-to-analog converters for converting said multi-channel digital audio output to a multi-channel analog audio output; and
   a plurality of low-order lowpass filters for attenuating the residue images of out-of-band noise in said multi-channel analog audio signal to complete said multi-channel analog audio signal reconstruction output.

10. The system of claim 9, wherein said multi-channel analog audio signal output is a multi-channel analog staircase waveform outputs, and said plurality of low-order lowpass filters are plurality of first order RC filters.

11. The system of claim 9, wherein said multi-channel shared resistor-string digital-to-analog converters comprises:
    a shared resistor string for providing voltage levels of each channel demand;
    a plurality of decoders for receiving a M bits modulated digital input signal and then outputting 2M digital signal;
    a plurality of switches connected to said shared resistor string and said plurality of decoders; and
    a plurality of buffers for outputting said selected voltage levels;
    wherein each of said plurality of switches corresponds to one said voltage level of said shared resistor string, and one of said 2M digital signal turning on one of said corresponding switch and then outputting the signal.

12. The system of claim 11, wherein said switch is MOS or CMOS.

13. A system of multi-channel shared resistor-string digital-to-analog converters, comprising:
    an interpolator for converting a multi-channel digital audio input at a sample rate into a multi-channel digital audio output with R multiples of said input sample rate;
    a modulator for modulating said multi-channel digital audio output to be a multi-channel digital audio output with a shorter sample wordlength and high-pass quantization noise;
    a multi-channel shared resistor-string digital-to-analog converters for converting said multi-channel digital audio output to a multi-channel analog audio output; and
    a plurality of filters for attenuating the residue images of out-of-band noise in said multi-channel analog audio to complete said multi-channel analog audio reconstruction output.

14. The system of claim 13, wherein said interpolator is a time-sharing interpolator, said modulator is a time-sharing sigma-delta modulator, said multi-channel analog audio output is a multi-channel analog staircase waveform outputs, and said plurality of filters are plurality of first order RC filters.

15. The system of claim 13, wherein said multi-channel shared resistor-string digital-to-analog converters comprises:

a shared resistor string for providing voltage levels of each channel demand;

a plurality of decoders for receiving a M bits modulated digital input signal and then outputting 2M digital signal;

a plurality of switches connected to said shared resistor string and said plurality of decoders; and a plurality of buffers for outputting said selected voltage levels;

wherein each of said plurality of switches corresponds to one said voltage level of said shared resistor string, and of one said said 2M digital signal turning on one of said corresponding switch, then outputting the signal.

16. A system of multi-channel shared resistor-string digital-to-analog converters, comprising:

a time-sharing interpolator for converting a multi-channel digital audio input at a sample rate into a multi-channel digital audio output with R multiples of said input sample rate;

a time-sharing sigma-delta modulator for modulating said multi-channel digital audio output to be a multi-channel digital audio output with a shorter sample wordlength and high-pass quantization noise;

a multi-channel shared resistor-string digital-to-analog converters for converting said multi-channel digital audio output to a multi-channel analog audio output; and a plurality of first order low-pass filters for attenuating the residue images of out-of-band noise in said multi-channel analog audio to complete said multi-channel analog audio reconstruction output.

17. The system of claim 16, wherein said multi-channel analog audio output is a multi-channel analog staircase waveform outputs.

18. The system of claim 16, wherein said multi-channel shared resistor-string digital-to-analog converters comprises:

a shared resistor string for providing voltage levels of each channel demand;

a plurality of decoders for receiving a M bits modulated digital input signal and then outputting 2M digital signal;

a plurality of switches connected to said shared resistor string and said plurality of decoders; and a plurality of buffers for outputting said selected voltage levels;

wherein each of said plurality of switches corresponds to one of said voltage level of said shared resistor string, and one of said 2M digital signal turning on one said corresponding switch, then outputting the signal.

19. The system of claim 18, wherein said switch is MOS or CMOS.

20. An output method of multi-channel shared resistor-string digital-to-analog converters, comprising:

converting a multi-channel digital audio input at a sample rate into a multi-channel digital audio output with R multiples of said input sample rate by an interpolator;

modulating said multi-channel digital audio output to be a multi-channel digital audio output with a shorter sample word length and high-pass quantization noise;

transforming said multi-channel digital audio output to a multi-channel analog audio output by using a multi-channel shared resistor-string digital-to-analog converters to; and attenuating the residue images of out-of-band noise in said multi-channel analog audio to complete said multi-channel analog audio reconstruction output by using a plurality of filters.

21. The output method of claim 20, wherein said interpolator is a time-sharing interpolator, said modulator is a time-sharing sigma-delta modulator, said multi-channel analog audio output is a multi-channel analog staircase waveform outputs, and said plurality of filters are plurality of first order RC filters.

22. The output method of claim 20, wherein said multi-channel shared resistor-string digital-to-analog converters comprises:

a shared resistor string for providing voltage levels of each channel demand;

a plurality of decoders for receiving a M bits modulated digital input signal and then outputting 2M digital signal;

a plurality of switches connected to said shared resistor string and said plurality of decoders; and a plurality of buffers for outputting said selected voltage levels;

wherein each of said plurality of switches corresponds to one said voltage level of said shared resistor string, and one of said 2M digital signal turning on one of said corresponding switch, then outputting the signal.

23. The output method of claim 22, wherein said switch is MOS or CMOS.

24. An output method of multi-channel shared resistor-string digital-to-analog converters, comprising:

using an interpolator to convert a multi-channel digital audio input at some sample rate into a multi-channel digital audio output with R multiples of said input sample rate;

using a multi-channel shared resistor-string digital-to-analog converters to convert said multi-channel digital audio output to a multi-channel analog audio output; and using a plurality of low-order low-pass filters to attenuate the residue images of out-of-band noise in said multi-channel analog audio to complete said multi-channel analog audio reconstruction output.

25. The output method of claim 24, wherein said interpolator is a time-sharing interpolator, said multi-channel analog audio output is a multi-channel analog staircase waveform outputs, and said plurality of low-order low-pass filters are plurality of first order RC filters.

26. The output method of claim 24, wherein said multi-channel shared resistor-string digital-to-analog converters comprises:

a shared resistor string for providing voltage levels of each channel demand;

a plurality of decoders for receiving a M bits modulated digital input signal and then outputting 2M digital signal;

a plurality of switches connected to said shared resistor string and said plurality of decoders; and a plurality of buffers for outputting said selected voltage levels;

wherein each of said plurality of switches corresponds to one said voltage level of said shared resistor string, and one of said 2M digital signal turning on one of said corresponding switch and outputting the signal.

27. The system of claim 26, wherein said switch MOS or CMOS.

28. An output method of multi-channel shared resistor-string digital-to-analog converters, comprising:
using a multi-channel shared resistor-string digital-to-analog converters to convert said multi-channel digital audio input to a multi-channel analog audio output; and
using a plurality of high-order low-pass filters to attenuate the residue images of out-of-band noise in said multi-channel analog audio to complete said multi-channel analog audio reconstruction output.

29. The output method of claim 28, wherein said multi-channel analog audio signal output is a multi-channel analog staircase waveform outputs, and said plurality of high-order low-pass filters are plurality of high-order RC filters.

30. The output method of claim 28, wherein said multi-channel shared resistor-string digital-to-analog converters comprises:
a shared resistor string for providing voltage levels of each channel demand;
a plurality of decoders for receiving a M bits modulated digital input signal and then outputting 2M digital signal;
a plurality of switches connected to said shared resistor string and said plurality of decoders; and
a plurality of buffers for outputting said selected voltage levels;
wherein each of said plurality of switches corresponds to one said voltage level of said shared resistor string, and one of said 2M digital signal turning on one of said corresponding switch, then outputting the signal.

31. The system of claim 30, wherein said switch is MOS or CMOS.

* * * * *